United States Patent
Kim et al.

(10) Patent No.: US 7,940,584 B2
(45) Date of Patent: May 10, 2011

(54) METHOD FOR INSPECTING THE ELECTRICAL PERFORMANCE OF A FLASH MEMORY CELL

(75) Inventors: Tae Kyu Kim, Shanghai (CN); Jong Woo Kim, Shanghai (CN); Xianghua Ye, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 401 days.

(21) Appl. No.: 11/927,432

(22) Filed: Oct. 29, 2007

(65) Prior Publication Data
US 2008/0133984 A1    Jun. 5, 2008

(30) Foreign Application Priority Data

Dec. 5, 2006    (CN) .......................... 2006 1 0119139

(51) Int. Cl.
*G11C 7/00* (2006.01)
(52) U.S. Cl. .................................. 365/201; 365/185.28
(58) Field of Classification Search .................... 365/201
See application file for complete search history.

(56) References Cited

U.S. PATENT DOCUMENTS

| 5,682,352 A | * | 10/1997 | Wong et al. | ................... 365/201 |
| 2002/0064911 A1 | * | 5/2002 | Eitan | ............................. 438/216 |
| 2004/0145950 A1 | * | 7/2004 | Yeh et al. | ................. 365/185.28 |
| 2006/0083067 A1 | | 4/2006 | Ueda | |

FOREIGN PATENT DOCUMENTS

JP    2001-266598    9/2001

OTHER PUBLICATIONS

Chinese Office Action of related application mailed May 8, 2009, 4 pgs. without translation.

* cited by examiner

*Primary Examiner* — Huan Hoang
*Assistant Examiner* — Jason Lappas
(74) *Attorney, Agent, or Firm* — Squire, Sanders & Dempsey (US) LLP

(57) ABSTRACT

The present invention discloses a method for inspecting the electrical performance of a flash memory cell, which comprises: performing electron-storage programming on a flash memory cell for a pre-determined period; screening out flash memory cells that reach a specified reference value as a mother batch of flash memory cells that meet the preliminary requirement, by measuring the threshold voltage; then performing a second electron-storage programming on the flash memory cells screened out for a certain time period; baking these flash memory cells; and finally, measuring the threshold voltage of these baked flash memory cells again and determining whether the threshold voltage can still be maintained at or above the reference value, so that it can be determined ultimately whether the flash memory cells meet the electrical performance requirements.

6 Claims, 2 Drawing Sheets

METHOD FOR INSPECTING THE ELECTRICAL PERFORMANCE OF A FLASH MEMORY CELL

The present application claims the priority of Chinese Patent Application No. 200610119139.3, titled "METHOD FOR INSPECTING THE ELECTRICAL PERFORMANCE OF A FLASH MEMORY CELL", and filed on Dec. 5, 2006, the whole content of which is incorporated herein by reference.

FIELD OF THE INVENTION

The present invention relates to flash memories, in particular, to a method for inspecting the electrical performance of a flash memory cell.

BACKGROUND OF THE INVENTION

A flash memory cell consists of an MOS transistor having a floating gate. The threshold voltage of the MOS transistor may be changed repeatedly by applying an electric field on its gate. This operation process is referred to as programming. Corresponding to the charges existing in the floating gate, the memory cell may have two threshold voltages, i.e., two states. When electrons in the floating gate accumulate, the threshold voltage of the memory cell may be increased, because the pre-charge level of the bit line and the read signal voltage applied to the control gate remain constant, and the memory cell is not turned on. The threshold voltage of the memory cell may be lowered by removing electrons from the floating gate. In this case, the signal voltage and the bit line used are grounded and discharged, and the transistor of the memory cell is turned on.

*Analysis and Design on CMOS Digital integrated Circuits* ($3^{rd}$ *Edition*), Publishing House of Electronics Industry, January 2005, discloses a method for programming flash memory cells, which comprises: increasing the threshold voltage by storing electrons to the floating gate of the MOS transistor of a flash memory cell via channel hot electron injection; and making the floating gate of the MOS transistor release electrons with tunneling mechanism, thus data programming can be performed on the flash memory cell. According to the principle of such a programming method, an electrical performance index of the flash memory cell, i.e. the electron accumulation ability of the floating gate, may be inspected by measuring the threshold voltage of the flash memory cell. That is, after a certain time period of electron-storage programming, whether the floating gate of the flash memory cell can accumulate sufficient electrons so as to make the threshold voltage reach a specified reference value. Therefore, in the existing inspection method, an inclement external environment is simulated to inspect a flash memory cell according to the practical application requirements. The existing inspection method is divided into four steps: electron-storage programming, pre-inspection, application simulation and final-inspection. As shown in FIG. 3, the electron-storage programming is to perform an electron-storage programming on a flash memory cell, so that the threshold voltage of the flash memory cell may be increased. The pre-inspection is to measure the threshold voltage of the flash memory cell, and if the threshold voltage obtained by measuring the flash memory cell reaches a specified reference value, it indicates that the electron accumulation ability of the floating gate of the flash memory cell is preliminarily acceptable, otherwise, it indicates that the electron accumulation ability of the floating gate of the flash memory cell is not acceptable, that is, the electrical performance is not acceptable. The application simulation is to simulate a practical application by establishing an inclement external environment using the batch of preliminarily acceptable flash memory cells screened out by the above method, so and so only can flash memory cells suitable for practical application be screened out. To establish a simulated inclement external environment, the flash memory cells are usually baked. The final-inspection is to measure the threshold voltage of the batch of preliminarily acceptable flash memory cells again and find out whether it can still be maintained at or above the specified reference value; if the threshold voltage of the flash memory cell drops below the specified reference value, then it is considered that the flash memory cell cannot endure practical application, and the electrical performance of such flash memory cells will be regarded as unacceptable, otherwise, the flash memory cell will be regarded as acceptable for practical application, and the electrical performance of such flash memory cells will be regarded as acceptable.

However, during baking, the threshold voltage of the flash memory cell may drop in some sort. As shown in FIG. 1, for some flash memory cells having a floating gate with strong electron accumulation ability, sufficient electrons may be accumulated during electron-storage programming, so that the threshold voltage is very high and it can still be maintained highly above the specified reference value even after it drops due to the baking during application simulation. However, for some flash memory cells of which the electrical performance is in a critical state, the threshold voltage is just at about the specified reference value after electron-storage programming; and the threshold voltage of these flash memory cells may drop below the specified reference value after baking. Thus, the electrical performance of these flash memory cells may inevitably be regarded as unacceptable, for their threshold voltage cannot reach the specified reference value. However, in fact, the electron accumulation ability of these flash memory cells is usually acceptable. Therefore, the prior art technology has the following defect: a large number of flash memory cells of which the electrical performance is in a critical state cannot pass the second threshold voltage inspection, and are considered as products with unacceptable electrical performance, thus the yield may be decreased.

SUMMARY OF THE INVENTION

The invention aims to solve the following problem: flash memory cells of which the electrical performance is in a critical state are regarded as unacceptable, so that yield is decreased.

To attain the above object, the invention provides a method for inspecting the electrical performance of a flash memory cell, which comprises the following steps:

first electron-storage programming: performing a programming on a flash memory cell for a pre-determined period, in which electrons are stored to a floating gate, so that the threshold voltage of the flash memory cell may be increased;

pre-inspection: measuring the threshold voltage of the flash memory cell after the electron-storage programming, and determining whether the threshold voltage reaches a specified reference value;

if the threshold voltage of the flash memory cell cannot reach the specified reference value, then regarding the electrical performance of the flash memory cell as unacceptable; otherwise, performing a second electron-storage programming on the flash memory cell;

application simulation: backing the flash memory cell after the second electron-storage programming;

final-inspection: measuring the threshold voltage of the flash memory cell after baking, and determining whether the threshold voltage is still maintained at or above the specified reference value;

if the threshold voltage of the flash memory cell can still be maintained at or above the specified reference value, regarding the electrical performance of the flash memory cell as acceptable; otherwise, regarding it as unacceptable.

In comparison with the prior art, the method for inspecting the electrical performance of a flash memory cell according to the invention has the following advantages: more electrons may be accumulated on the floating gate of the flash memory cell by performing the second electron-storage programming before the application simulation on the flash memory cell which has passed the pre-inspection, so that the threshold voltage may be further increased, that is, the threshold voltage margin is increased to compensate the threshold voltage drop of the flash memory cell caused by baking. Therefore, the voltage margin of the flash memory cells of which the electrical performance is in a critical state is increased sufficiently, and the threshold voltage of these flash memory cells can still be maintained above the specified reference value even after the baking during the application simulation, so that the electrical performance of these flash memory cells may be regarded as acceptable and the yield may be improved.

DETAILED DESCRIPTION OF THE EMBODIMENTS

In the method for inspecting the electrical performance of a flash memory cell according to the invention, a second electron-storage programming is performed before the baking during the application simulation of the prior art inspection method, so that the threshold voltage margin is increased and the threshold voltage drop caused by the baking may be compensated. The method for inspecting the electrical performance of a flash memory cell according to the invention comprises the following steps:

first electron-storage programming: performing a programming on a flash memory cell for a pre-determined period, in which electrons are stored to a floating gate;

pre-inspection: measuring the threshold voltage of the flash memory cell after the electron-storage programming, and determining whether the threshold voltage reaches a specified reference value;

if the threshold voltage of the flash memory cell cannot reach the specified reference value, then regarding the electrical performance of the flash memory cell as unacceptable; otherwise, performing a second electron-storage programming on the flash memory cell;

application simulation: backing the flash memory cell after the second electron-storage programming;

final-inspection: measuring the threshold voltage of the flash memory cell after baking, and determining whether the threshold voltage is still maintained at or above the specified reference value;

if the threshold voltage of the flash memory cell can still be maintained at or above the specified reference value, regarding the electrical performance of the flash memory cell as acceptable; otherwise, regarding it as unacceptable.

The first electron-storage programming is an operation for injecting hot electrons into a flash memory cell for a time period of 4 microseconds, so that the threshold voltage of a flash memory cell with acceptable electrical performance may reach a specified reference value of 6.5 V.

The second electron-storage programming is also an operation for injecting hot electrons for a time period of 3 to 5 microseconds, so that the threshold voltage margin of the flash memory cell may be increased and the threshold voltage drop caused by baking may be compensated.

Said baking is performed at 250° C. for 24 hours.

Figure 3:
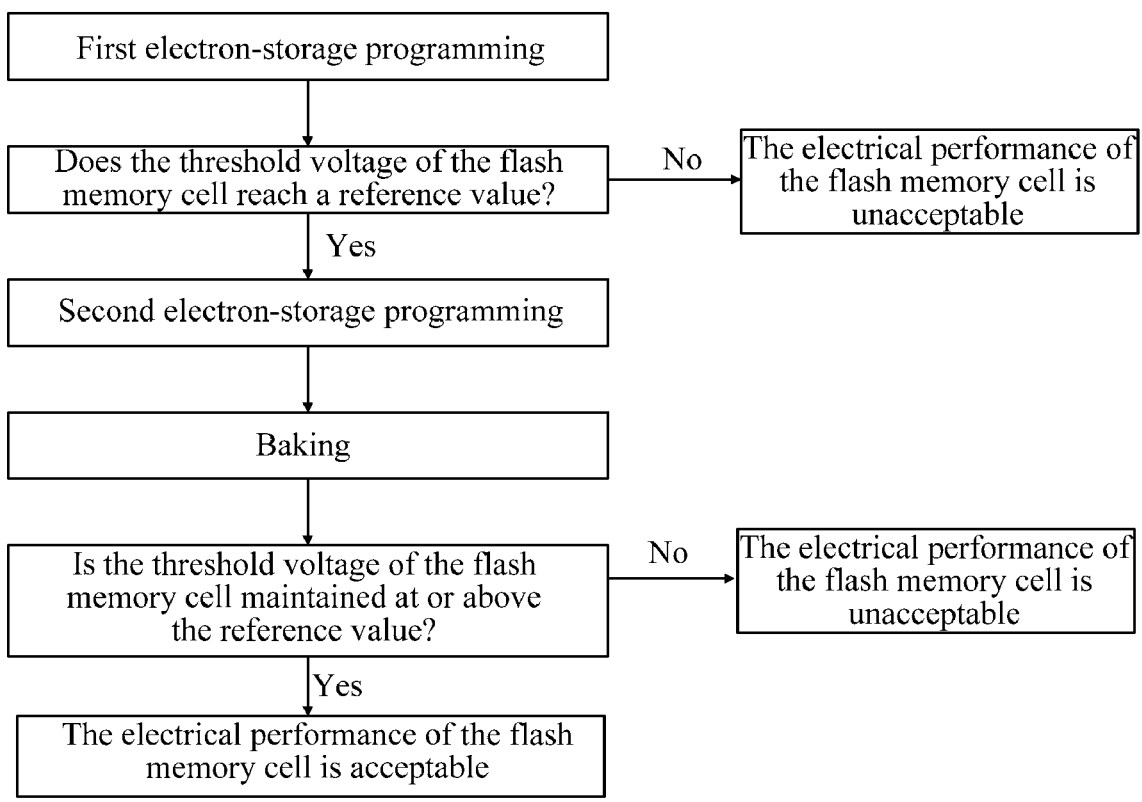
FIG. 3 is a flow chart of the method for inspecting the electrical performance of a flash memory cell according to the invention.

Now, the method for inspecting the electrical performance of a flash memory cell according to the invention will be illustrated in detail in conjunction with FIG. 3.

First of all, hot electrons are injected into a flash memory cell for a time period of 4 microseconds, so that electrons in the floating gate are accumulated and the threshold voltage is increased; and after 4 microseconds of hot electron injection, the threshold voltage of a flash memory cell with acceptable electrical performance may reach a specified reference value of 6.5 V.

Next, measure the threshold voltage of the flash memory cell into which hot electrons were injected, and determine whether the threshold voltage of the flash memory cell can reach the specified reference value of 6.5 V.

If the threshold voltage of the flash memory cell measured cannot reach 6.5 V, it indicates that the floating gate of the flash memory cell has a poor electron accumulation ability, that is, the electrical performance is unacceptable.

If the threshold voltage of the flash memory cell inspected reaches 6.5 V, it indicates that the electron accumulation ability of the floating gate of the flash memory cell is preliminarily acceptable. At this point, hot electrons are again injected into the flash memory cell, so that more electrons are accumulated on the floating gate of the flash memory cell. As a result, the threshold voltage of the flash memory cell may be further raised and the threshold voltage margin of the flash memory cell may be increased. In fact, when the time period for injecting hot electrons is less than 3 microseconds, the threshold voltage margin increased is insufficient to compensate the threshold voltage drop caused by baking; and when the time period for injecting hot electrons is greater than 5 microseconds, the cost of the inspection is increased greatly. Therefore, the time period for injecting hot electrons between 3 and 5 microseconds is sufficient to compensate the threshold voltage drop.

Then, the flash memory cell into which hot electrons were again injected is baked at 250° C. for 24 hours, so that an inclement practical application environment may be simulated.

Finally, measure the threshold voltage of the flash memory cell after baking again and determine whether the threshold voltage of the flash memory cell is still maintained at or above the specified reference value of 6.5 V.

If the threshold voltage of the flash memory cell measured is stilled maintained at or above 6.5 V, it indicates that the electron accumulation ability of a floating gate of the flash memory cell is good and can meet the requirements of practical applications, that is, the electrical performance is acceptable; otherwise, it indicates that the electron accumulation ability of a floating gate of the flash memory cell cannot meet the requirements of practical applications, that is, the electrical performance is unacceptable.

In the method for inspecting the electrical performance of a flash memory cell according to the invention, the yield of the flash memory cells on the entire wafer may be measured in the following steps:

First of all, hot electrons are injected into all flash memory cells on the entire wafer for 4 microseconds.

Then, start a pre-inspection, that is, measure the threshold voltage of the flash memory cells starting from the first flash memory cell on the wafer, and determine whether the threshold voltage of the flash memory cell reaches a specified reference value of 6.5 V.

If the threshold voltage of the flash memory cell measured cannot reach 6.5 V, it indicates that the floating gate of the flash memory cell has a poor electron accumulation ability, that is, the electrical performance is unacceptable, and it's counted as bad cell; otherwise, it indicates that the electron accumulation ability of a floating gate of the flash memory cell is preliminarily acceptable.

A pre-inspection on the second flash memory cell is started according to the above method and the bad cells are counted. If during the pre-inspection, the count of bad cells exceeds 1000, then it is determined that the device fails, and the pre-inspection on the entire wafer ends; otherwise, go on with the pre-inspection until all the flash memory cells on the wafer are pre-inspected.

Then, hot electrons are again injected into all the flash memory cells that have passed the pre-inspection for a duration of 4 microseconds.

After that, the entire wafer is baked at 250° C. for 24 hours, so that an inclement practical application environment is simulated;

Finally, perform a final-inspection, that is, measure the threshold voltage of the flash memory cells subjected to baking one by one again, and determine whether the threshold voltage of the flash memory cells is still maintained at or above the specified reference value of 6.5 V.

If the threshold voltage of the flash memory cell measured is still maintained at or above 6.5 V, it indicates that the electron accumulation ability of the floating gate of the flash memory cell is good and meets the requirements of practical applications, that is, the electrical performance is acceptable.

If the threshold voltage of the flash memory cell measured drops below 6.5 V, it indicates that the electron accumulation ability of floating gate of the flash memory cell cannot meet the requirements of practical applications, that is, the electrical performance is unacceptable, and the bad cells are counted in the way as described in the pre-inspection. If the cumulative number of bad cells in the final-inspection and in the pre-inspection exceeds 1000, then it is determined that the device fails, and the final-inspection on the entire wafer ends; otherwise, go on with the final-inspection until all the flash memory cells on the wafer subjected to baking are finally inspected;

Subsequently, the flash memory cells that have not been inspected are recorded, and the yield of the flash memory cells on the entire wafer is obtained.

Figure 1:
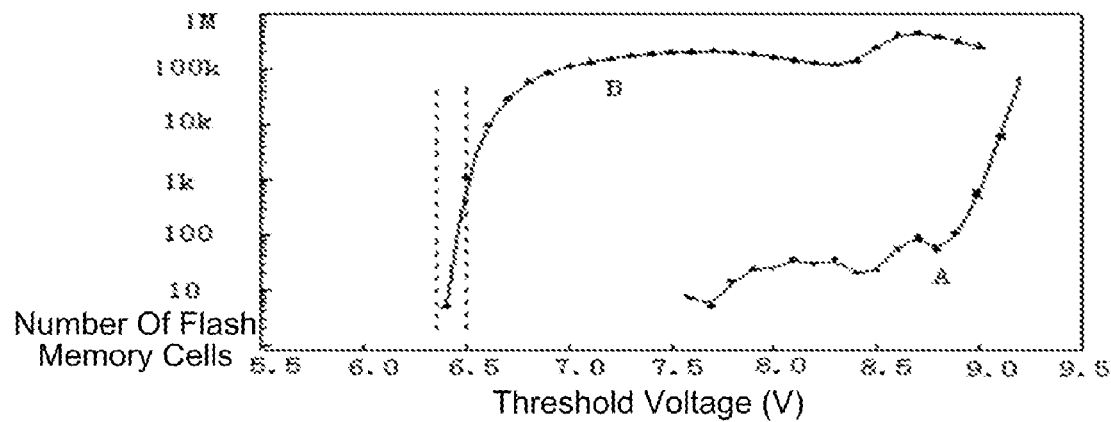
FIG. 1 is a diagram showing the statistical result of a prior art method for inspecting the electrical performance of the flash memory cells on a wafer.
Figure 2:
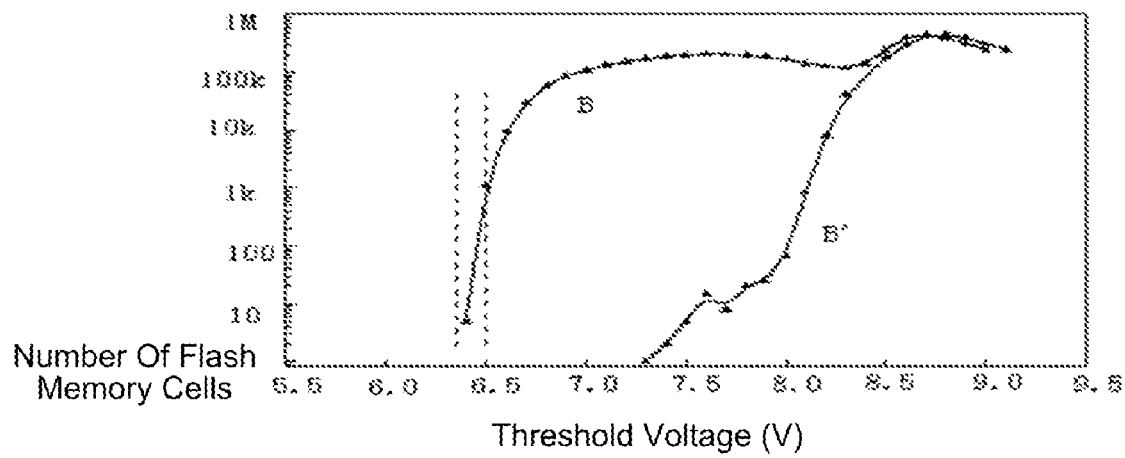
FIG. 2 is a diagram showing the statistical results of the prior art method and the method of the present invention for inspecting the electrical performance of the same flash memory cells, respectively.

In FIG. 2, B represents a statistical curve obtained by inspecting the electrical performance of flash memory cells on a wafer using a prior art method, and B' represents a statistical curve obtained by inspecting the electrical performance of flash memory cells on a wafer using the method for inspecting the electrical performance of a flash memory cell according to the invention. As shown in FIG. 2, in Curve B, there are more than 1K flash memory cells of which the threshold voltage is below 6.5 V, and in such a case, it will be determined that the device fails. In fact, however, as described above, after baking, the threshold voltage of flash memory cells of which the electrical performance is in a critical state may drop below 6.5, whereas the electrical performance of these flash memory cells is acceptable and these flash memory cells should not be regarded as bad cells. Therefore, the existing inspection method is unfavorable for the yield of flash memory cells on a wafer, that is, a batch of flash memory cells that are acceptable may be regarded as bad cells and discarded. In contrast, in Curve B', the threshold voltage of nearly all the flash memory cells is above 7.0 V. According to this data, the electrical performance of nearly all the flash memory cells on a wafer is acceptable, because the second hot electron injection performed on the flash memory cells before baking makes the threshold voltage of the flash memory cells increased again, and finally, the threshold voltage of the flash memory cells still can be maintained above 7.0 V even if it is lowered a little due to baking. Thus, in comparison with Curve B, the number of flash memory cells of which the electrical performance can be regarded as acceptable may be increased greatly, so that the yield of flash memory cells on a wafer can be improved. Moreover, it can be seen that a large number of acceptable flash memory cells that may be discarded as bad cells in the prior art will be saved by using the method for inspecting the electrical performance of the flash memory cell according to the invention.

The invention claimed is:

1. A method for inspecting the electrical performance of a flash memory cell, comprising:
    performing a first electron-storage programming of the flash memory cell;
    conducting pre-inspection of the flash memory cell;
    performing a second electron-storage programming on the flash memory cell which has passed the pre-inspection, in order to increase the threshold voltage margin of the memory cell, wherein performing the second electron-storage programming includes injecting hot electrons into the floating gate of the flash memory cell, and the time for injecting hot electrons is 3 to 5 seconds;
    conducting application simulation of the flash memory cell; and
    conducting final-inspection of the flash memory cell.

2. The method for inspecting the electrical performance of a flash memory cell according to claim 1, wherein the step of performing the first electron-storage programming includes injecting hot electrons into the floating gate of the flash memory cell.

3. The method for inspecting the electrical performance of a flash memory cell according to claim 2, wherein the duration of the first electron-storage programming is 4 microseconds.

4. The method for inspecting the electrical performance of a flash memory cell according to claim 1, wherein the step of conducting the pre-inspection includes determining whether the threshold voltage of the flash memory cell reaches a specified reference value of 6.5 V.

5. The method for inspecting the electrical performance of a flash memory cell according to claim 1, wherein the step of conducting the application simulation includes baking the flash memory cell at 250° C. for 24 hours.

6. The method for inspecting the electrical performance of a flash memory cell according to claim 1, wherein the step of conducting the final-inspection includes determining whether the threshold voltage of the flash memory cell is still maintained at or above the specified reference value of 6.5 V.

* * * * *